United States Patent
Hongo et al.

(10) Patent No.: US 6,959,174 B2
(45) Date of Patent: *Oct. 25, 2005

(54) AMPLIFYING DEVICE

(75) Inventors: Naoki Hongo, Tokyo (JP); Yoichi Okubo, Tokyo (JP); Masaki Suto, Tokyo (JP); Tetsuhiko Miyatani, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 440 days.

This patent is subject to a terminal disclaimer.

(21) Appl. No.: 10/229,017

(22) Filed: Aug. 28, 2002

(65) Prior Publication Data

US 2003/0045253 A1 Mar. 6, 2003

(30) Foreign Application Priority Data

Aug. 31, 2001 (JP) .................................... P. 2001-263862

(51) Int. Cl.$^7$ ................................................. H04B 1/04
(52) U.S. Cl. ................................ 455/114.3; 455/127.1; 375/297
(58) Field of Search ............................ 455/114.2, 114.3, 455/127.1, 194.2; 375/216, 254, 285, 296, 297; 330/10, 149

(56) References Cited

U.S. PATENT DOCUMENTS 5,903,823 A * 5/1999 Moriyama et al. .......... 455/126
6,388,518 B1 * 5/2002 Miyatani ..................... 330/149
6,449,466 B1 * 9/2002 Jin et al. ................. 455/127.2
2001/0007435 A1   7/2001 Ode et al. ................... 330/149
2002/0064236 A1 * 5/2002 Matsuoka et al. .......... 375/296
2003/0045247 A1 * 3/2003 Hongo et al. ............... 455/115

FOREIGN PATENT DOCUMENTS

JP    2000-151295    11/1998
JP    2001-251148     9/2001

* cited by examiner

Primary Examiner—Nguyen T. Vo
Assistant Examiner—Nhan T. Le
(74) Attorney, Agent, or Firm—Jacobson Holman PLLC

(57) ABSTRACT

To provide an amplifying device which is reduced in size, weight and cost and which can improve the distortion compensation performance. In the amplifying device, input signals are each subjected to digital orthogonal modulation using an IF and further to offset rotation processing in digital orthogonal modulators, then bifurcated into a main signal system and a control system, and detection of a power value is performed at an IF band in a power detecting section of the control system. Therefore, offset rotation processing of the input signals in the power detection is not required, so that a structure for matching phases of a multi-carrier signal and a power value signal is not required, resulting in improving the distortion compensation performance without using an analog delay line.

8 Claims, 4 Drawing Sheets

AMPLIFYING DEVICE

BACKGROUND OF THE INVENTION

1. Field of the Invention

The present invention relates to a mobile communication system, such as a portable telephone system, and in particular, to an amplifying device for use in a base station device.

2. Description of the Related Art

In the mobile communication system, such as the portable telephone system, a base station device is required to ensure arrival of a radio signal at a mobile station device which is located far from the base station device. Accordingly, it is necessary for the base station device to largely amplify a signal through an amplifier for transmitting it.

In the foregoing mobile communication system, the W-CDMA (Wide-band Code Division Multiple Access) system and so on have been adopted as mobile communication systems.

However, since an amplifier is an analog device, its input-output characteristics form a nonlinear function. Particularly, after exceeding the amplification limit point called a saturation point, the output power remains nearly constant even if the power inputted to the amplifier increases.

This nonlinear output causes nonlinear distortion. In case of a transmission signal before amplification, a signal component outside a desired signal band is suppressed to a low level through a band limiting filter. On the other hand, in case of a signal after passing the amplifier, nonlinear distortion is generated so that a signal component leaks to the exterior of the desired signal band (adjacent channels). This causes a phenomenon that the power spectrum expands to the adjacent channels.

As described above, since the transmission power is high in the base station device, the magnitude of the leak power to the adjacent channels is strictly regulated. Under these circumstances, it has been a large problem how to reduce the foregoing adjacent channel leak power.

For amplifying the transmission power while reducing the adjacent channel leak power, a distortion compensation amplifying device using the predistortion technique has been provided in the base station device for amplifying the transmission power.

The conventional distortion compensation amplifying device using the predistortion technique is described in JP-A-2000-151295 for "DISTORTION COMPENSATION CIRCUIT" published on May 30, 2000 (Applicant: Mitsubishi Electric Corporation; Inventors: Kenichi Horiguchi and others).

In this prior art, a portion of an input signal inputted to a signal path having a vector adjuster, a linearizer and an amplifier and a portion of an output signal outputted from the amplifier are respectively extracted, and a combined power level of these signals is detected, and then, based on a detection result, a bias adjustment of the linearizer and an adjustment of the vector adjuster are carried out so as to minimize the power level.

However, since the foregoing conventional amplifying device uses the analog delay line to delay the input signal, it is increased in size, weight and cost. In view of this, it has been under review to achieve an amplifying device without using the analog delay line, wherein a digital delay line is used instead of the analog delay line, the power detection is carried out using a digital input signal, and phases of the multi-carrier signal and the power value signal are synchronized.

In the distortion compensation amplifying device using the predistortion technique, it is necessary to match the phases of the multi-carrier signal and the power value signal in the predistorter for giving accurately the distortion compensation characteristic to the input signal. For detecting the power value using the digital input signal as referred to above, it is necessary to perform a frequency adjustment in consideration of frequency differences between the respective carriers. By matching phases of this processing and the conversion to the carrier frequencies with each other, the phases of the multi-carrier signal and the power value signal can be matched.

However, while the phase control with higher accuracy than that of the amplifying device of FIG. 5 is required for matching the phases, it is difficult to realize it, which has been a problem for improving the distortion compensation performance.

SUMMARY OF THE INVENTION

The present invention has been made in view of the above, and has an object to provide an amplifying device which is reduced in size, weight and cost and which can improve the distortion compensation performance.

For solving the foregoing problem of the prior art, according to the present invention, there is provided an amplifying device, wherein input signals are, per carrier, subjected to digital orthogonal modulation and further to offset rotation processing in digital orthogonal modulating sections, then combined in a coupling section, and a digital delay section for performing digital-delaying for a constant time is used in a main signal system or a control system instead of an analog delay line, and further, a distortion compensating section gives distortion compensation to a multi-carrier signal for canceling a nonlinear characteristic generated in an amplifying section, based on a power value and a portion of an output from a distributing section. Therefore, the amplifying device according to the present invention requires no analog delay lines and enables a phase control between the main signal system and the control system in the digital orthogonal modulating sections, and thus can be provided with reduced size, weight and cost.

According to the present invention, there is also provided an amplifying device, wherein input signals are, per carrier, subjected to digital orthogonal modulation and further to offset rotation processing in digital orthogonal modulating sections, then combined in a coupling section, and a digital delay section for performing digital-delaying for a constant time is used in a main signal system or a control system instead of an analog delay line, and further, a distortion compensating section controls a multi-carrier signal for reducing an error between the demodulated contents of outputs from an up-convert section and a distributing section relative to a power value. Therefore, the amplifying device according to the present invention requires no analog delay lines and enables a phase control between the main signal system and the control system in the digital orthogonal modulating sections, and thus can be provided with reduced size, weight and cost.

Figure 1:
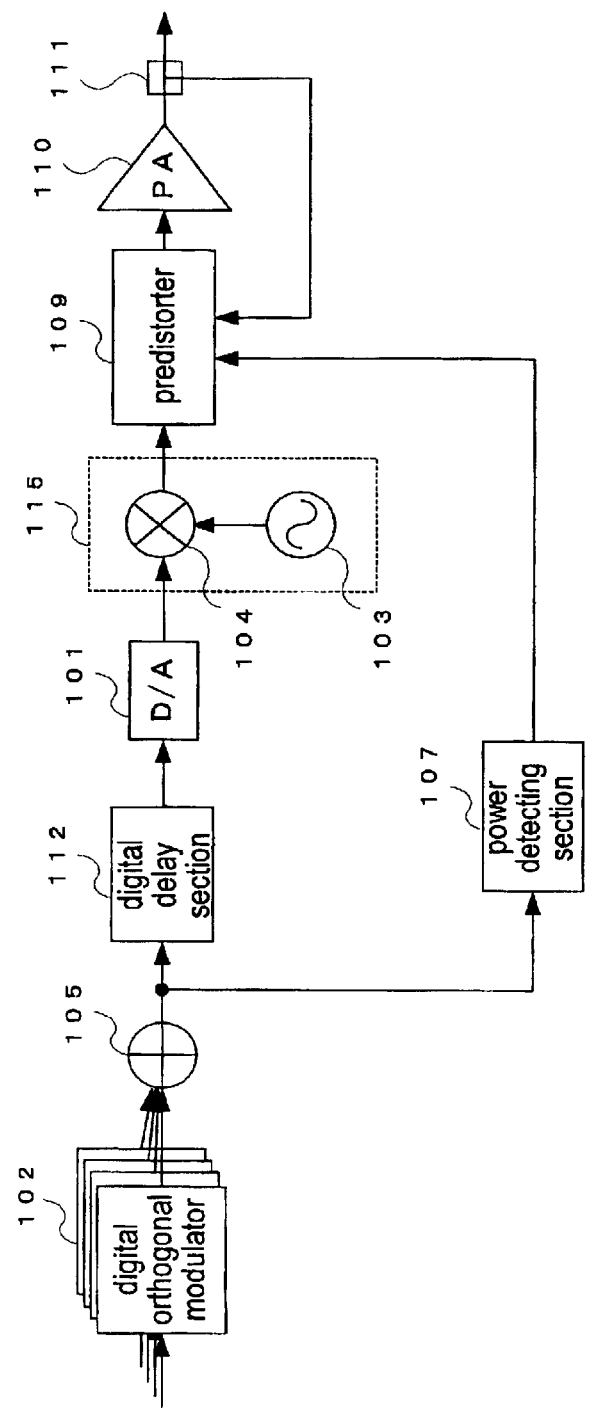
FIG. 1 is a first structural block diagram of a distortion compensation amplifying device according to an embodiment of the present invention.

DESCRIPTION OF REFERENCE NUMERALS 101, 201 . . . D/A converter, 102 . . . digital orthogonal modulator, 103, 126, 203 . . . VCO, 104, 127, 204 . . . mixer, 105, 205 . . . coupler, 107 . . . power detecting section, 109, 209 . . . predistorter, 110, 210 . . . amplifier, 111, 206, 211 . . . distributor, 115 . . . up-convert section, 121-1 . . . attenuation control section, 121-2 . . . phase control section, 122-1, 122-2 . . . D/A converter, 123 . . . attenuator, 124 . . . phasing device, 125, 125' . . . table producing section, 128 . . . LPF, 129 . . . A/D converter, 130-1, 130-2 . . . demodulating section, 131 . . . comparing section, 202 . . . orthogonal modulator, 207 . . . power detector, 208 . . . delay line

DESCRIPTION OF THE PREFERRED EMBODIMENT

Preferred embodiments of the present invention will be described hereinbelow with reference to the accompanying drawings.

Function realizing sections which will be described hereinbelow, each may be any circuit or device, or a part of or the whole of its function may be realized by software, as long as it can realize such a function. Further, the function realizing section may be realized by a plurality of circuits, or the plurality of function realizing sections may be realized by a single circuit.

In an amplifying device according to the embodiment of the present invention, input signals are, per carrier, subjected to digital orthogonal modulation and further to offset rotation processing in digital orthogonal modulating sections, then combined in a coupling section, and a digital delay section for performing digital-delaying for a constant time is used in a main signal system or a control system instead of an analog delay line, and further, a distortion compensating section gives distortion compensation to a multi-carrier signal for canceling a nonlinear characteristic generated in an amplifying section, based on a power value and a portion of an output from a distributing section. Therefore, the amplifying device according to the present invention requires no analog delay lines and enables a phase control between the main signal system and the control system in the digital orthogonal modulating sections, and thus can be provided with reduced size, weight and cost.

A digital orthogonal modulating section in claims corresponds to a digital orthogonal modulator, a coupling section to a coupler, a digital/analog converting section to a digital/analog converter, an amplifying section to an amplifier, a distributing section to a distributor, and a distortion compensating section to a predistorter.

A structure of an amplifying device according to the embodiment of the present invention will be described referring to FIG. 1. FIG. 1 is a structural block diagram of a distortion compensation amplifying device according to the embodiment of the present invention.

Like the prior art, the amplifying device of FIG. 1 uses the predistortion technique and applies an amplification process to input signals of respective carriers in the form of digital signals. In the distortion compensation amplifying device of FIG. 1, the number of carriers is 4. However, the number of carriers of input signals may be set to a different value.

The amplifying device of FIG. 1 comprises digital orthogonal modulators 102, a coupler 105, a digital delay section 112, a D/A converter (D/A in the figure) 101, an up-convert section 115, a power detecting section 107, a predistorter 109, an amplifier (PA (Power Amplifier) in the figure) 110 and a distributor 111.

The up-convert section 115 comprises a VCO (Voltage Controlled Oscillator) 103 and a mixer 104.

In the amplifying device of FIG. 1, the digital orthogonal modulator 102 is provided per carrier of the input signal.

Each digital orthogonal modulator 102 performs orthogonal modulation of the input signal in the form of a digital signal and outputs it to the coupler 105. Upon performing the orthogonal modulation, the digital orthogonal modulators 102 carry out offset rotation processing of the input signals of the respective carriers corresponding to carrier frequency differences.

The coupler 105 combines the input signals of the respective carriers outputted from the digital orthogonal modulators 102 to produce a multi-carrier signal, and outputs it to the digital delay section 112 and the power detecting section 107.

The digital delay section 112 digital-delays the multi-carrier signal for a constant time and outputs it to the D/A converter 101. The digital delay section 112 is constituted using, for example, a memory buffer.

The D/A converter 101 converts the multi-carrier signal in the form of a digital signal to an analog signal and outputs it to the up-convert section 115.

The up-convert section 115 up-converts the multi-carrier signal to an RF frequency (Radio Frequency) and outputs it to the predistorter 109.

In the up-convert section 115, the VCO 103 and the mixer 104 are provided, and the mixer 104 carries out frequency conversion according to a carrier frequency outputted from the VCO 103, then necessary band limitation is performed using a band limiting filter (not shown) or the like.

The power detecting section 107 detects a power value by calculating the power value based on the inputted multi-carrier signal, and outputs the detected power value to the predistorter 109 as a power value signal.

The predistorter 109 executes a control of giving a distortion compensation characteristic, relative to the multi-carrier signal inputted from the up-convert section 115, and outputs it to the PA 110.

The predistorter 109 gives to the multi-carrier signal inputted from the up-convert section 115 such a distortion compensation characteristic that cancels a nonlinear characteristic generated in the PA 110, based on the power value signal outputted from the power detecting section 107 and the amplified multi-carrier signal outputted from the distributor 111.

The amplifier 110 amplifies the multi-carrier signal and outputs it.

The distributor 111 carries out distribution of the amplified multi-carrier signal outputted from the amplifier 110 so as to output it to the exterior and feedback it to the predistorter 109.

Figure 2:
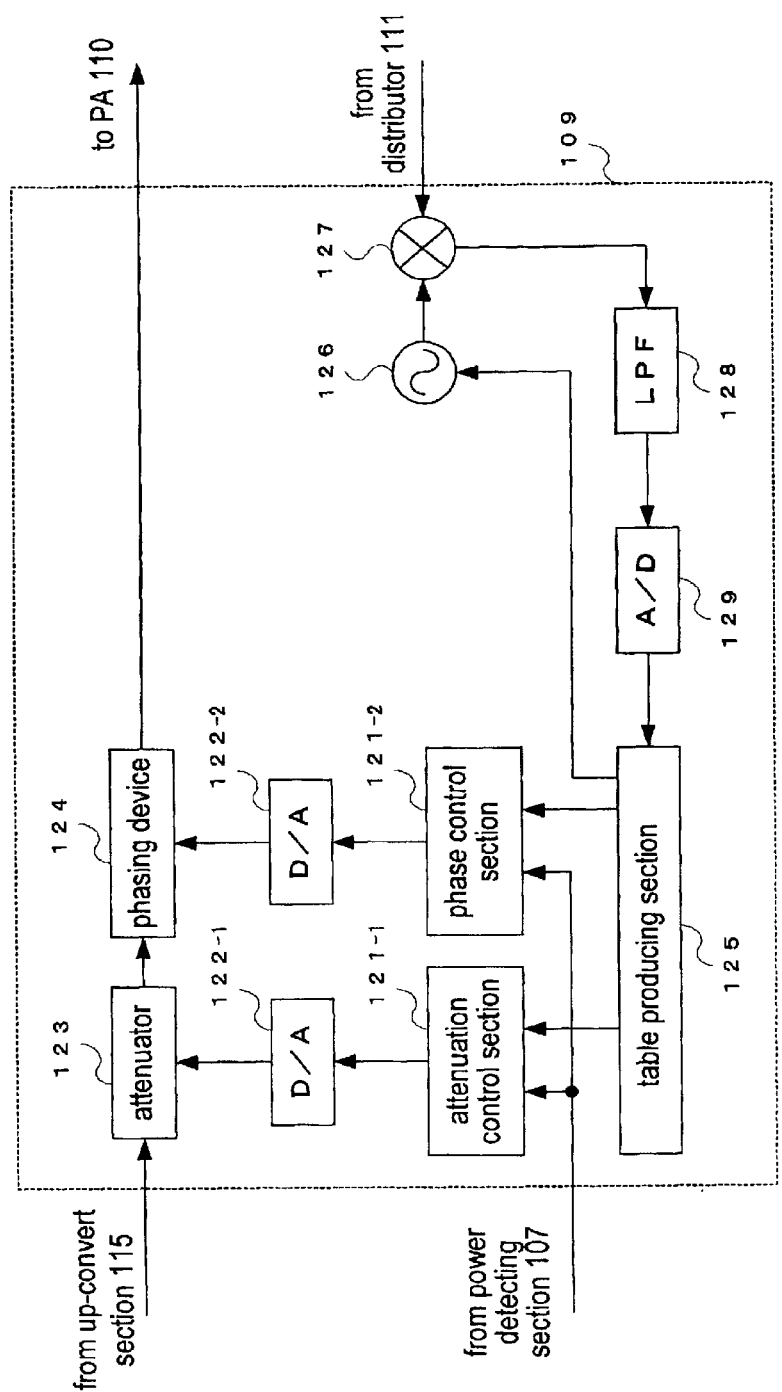
FIG. 2 is a structural block diagram of a predistorter 109.

Now, a structure of the predistorter 109 will be described referring to FIG. 2. FIG. 2 is a structural block diagram of the predistorter 109 in the distortion compensation amplifying device according to the embodiment of the present invention.

The predistorter 109 comprises an attenuation control section 121-1, a phase control section 121-2, D/A converters (D/A in the figure) 122-1 and 122-2, an attenuator 123, a phasing device 124, a table producing section 125, a VCO 126, a mixer 127, an LPF (Low Pass Filter) 128, and an A/D converter (A/D in the figure).

In FIG. 2, the positioning order of the attenuator 123 and the phasing device 124 may be changed.

The attenuation control section 121-1 stores therein an LUT (Look Up Table) showing a relationship between power values and attenuations reflecting distortion compensation characteristics, refers to the LUT based on the inputted power value signal, and outputs an attenuation control signal corresponding to a reference result to the D/A converter 122-1.

Further, based on a control command from the table producing section 125, the attenuation control section 121-1 updates the LUT to adjust attenuations.

The phase control section 121-2 stores therein an LUT showing a relationship between power values and phase control amounts reflecting distortion compensation characteristics, refers to the LUT based on the inputted power value signal, and outputs a phase control signal corresponding to a reference result to the D/A converter 122-2.

Further, based on a control command from the table producing section 125, the phase control section 121-2 updates the LUT to adjust phase control amounts.

The D/A converters 122-1 and 122-2 respectively convert the attenuation control signal outputted from the attenuation control section 121-1 and the phase control signal outputted from the phase control section 121-2 into analog signals, and output them to the attenuator 123 and the phasing device 124.

Based on the attenuation control signal outputted from the attenuation control section 121-1 and analog-converted in the D/A converter 122-1, the attenuator 123 carries out attenuation processing corresponding to a distortion compensation characteristic relative to the inputted multi-carrier signal.

Based on the phase control signal outputted from the phase control section 121-2 and analog-converted in the D/A converter 122-2, the phasing device 124 carries out phase control processing corresponding to a distortion compensation characteristic relative to the inputted multi-carrier signal.

Based on a distortion component extracted from the amplified multi-carrier signal outputted from the amplifier 110 and fed back from the distributor 111, the table producing section 125 outputs the control commands to the attenuation control section 121-1 and the phase control section 121-2 for updating the LUTs stored in the attenuation control section 121-1 and the phase control section 121-2, respectively.

Further, the table producing section 125 outputs a control signal to the VCO 126 for controlling a frequency for distortion component extraction.

In the predistorter of FIG. 2, the table producing section 125 may be constituted using a DSP (Digital Signal Processor) or the like.

Based on the control signal outputted from the table producing section 125, the VCO 126 outputs the frequency for distortion component extraction to the mixer 127.

The mixer 127 performs frequency conversion of the amplified multi-carrier signal fed back from the distributor 111 to convert it to the frequency outputted from the VCO 126.

When the amplified multi-carrier signal subjected to the frequency conversion passes through the LPF 128, the LPF 128 attenuates frequency components above a constant value and extracts a distortion component.

In the predistorter of FIG. 2, a BPF (Band Pass Filter) may be used instead of the LPF 128.

The A/D converter 129 digital-converts the distortion component extracted in the LPF 128, and outputs it to the table producing section 125 as a digital signal.

Now, an operation of the distortion compensation amplifying device according to the embodiment of the present invention will be described referring to FIGS. 1 and 2.

In the amplifying device of FIG. 1, the input signal of each carrier is inputted to the corresponding digital orthogonal modulator 102 and subjected to orthogonal modulation. Each digital orthogonal modulator 102 performs orthogonal modulation using an IF (Intermediate Frequency) and outputs the orthogonal-modulated input signal in the form of a digital IF signal to the coupler 105.

Further, in the digital orthogonal modulator 102, the digital IF signal of each carrier is subjected to the offset rotation processing corresponding to a carrier frequency difference. For example, when the carrier frequencies of the respective carriers are 2000 MHz, 2005 MHz, 2010 MHz and 2015 MHz, the digital orthogonal modulators 102 corresponding to the respective carriers apply offset rotation of $f_{IF}$ MHz, $f_{IF}+5$ MHz, $f_{IF}+10$ MHz and $f_{IF}+15$ MHz to the digital IF signals, respectively, given that the IF is represented by $f_{IF}$. Specifically, in the digital orthogonal modulators 102, the offset rotation processing is executed for the digital IF signals in consideration of carrier frequency differences between the respective carriers.

The coupler 105 combines the inputted digital IF signals of the respective carriers to produce a multi-carrier signal, and outputs it to the digital delay section 112 and the power detecting section 107.

Hereinafter, in the amplifying device of FIG. 1, a series of circuits from the digital orthogonal modulators 102 to the D/A converter 101 will be referred to as a main signal system, and the power detecting section 307 will be referred to as a control system.

In the main signal system, the multi-carrier signal inputted to the digital delay section 112 is digital-delayed for a constant time, and then, outputted to the D/A converter 101. The digital delay section 112 corresponds to the conventional analog delay line, wherein a delay amount of the multi-carrier signal is set for matching the timings of the multi-carrier signal and the power value signal in the predistorter 109.

The multi-carrier signal is converted to an analog signal in the D/A converter 101, then inputted to the up-convert section 115. In the up-convert section 115, the VCO 103 and the mixer 104 are provided in pair. The multi-carrier signal is converted by the mixer 104 to the carrier frequency outputted from the VCO 103, thereby to be up-converted to the RF frequency.

The multi-carrier signal up-converted in the up-convert section 115 is outputted to the predistorter 109.

In the control system, the multi-carrier signal being the digital IF signal is outputted to the power detecting section 107. The power detecting section 107 detects a power value by calculating the power value based on the multi-carrier signal. The power detecting section 107 outputs the detected power value to the predistorter 109 as a power value signal.

In the power detecting section 107, the power value can be calculated by squaring a voltage value of the multi-carrier signal, for example.

Further, in the power detecting section 107, it may be arranged that a band limiting filter (not shown) is provided thereby to perform band limitation within a signal band onto a calculation result if necessary, and a band limitation result is outputted as a power value.

The multi-carrier signal outputted from the up-convert section 115 and the power value signal outputted from the power detecting section 107 are inputted to the predistorter 109. Based on the inputted power value signal, the predistorter 109 executes a control of giving a distortion compensation characteristic to the multi-carrier signal.

Hereinbelow, an operation of the predistorter 109 will be described referring to FIG. 2. As shown in FIG. 2, in the predistorter 109, the power value signal is inputted to the attenuation control section 121-1 and the phase control section 121-2. The attenuation control section 121-1 and the phase control section 121-2 respectively store the LUT showing the relationship between power values and attenuations and the LUT showing the relationship between power values and phase control amounts. In each control section, the attenuation or phase control amount reflecting the distortion compensation characteristic can be specified by referring to the LUT based on the power value.

In the attenuation control section 121-1, when the LUT is referred to based on the inputted power value to specify the corresponding attenuation, the attenuation is outputted to the D/A converter 122-1 as the attenuation control signal. In the D/A converter 122-1, the attenuation control signal is analog-converted and outputted to the attenuator 123. In the attenuator 123, based on the inputted attenuation control signal, the attenuation processing of the multi-carrier signal reflecting the distortion compensation characteristic is carried out.

In the phase control section 121-2, when the LUT is referred to based on the inputted power value to specify the corresponding phase control amount, the phase control amount is outputted to the D/A converter 122-2 as the phase control signal. In the D/A converter 122-2, the phase control signal is analog-converted and outputted to the phasing device 124. In the phasing device 124, based on the inputted phase control signal, the phase control processing of the multi-carrier signal reflecting the distortion compensation characteristic is carried out.

The multi-carrier signal, given the distortion compensation characteristic through the attenuation processing and the phase control processing, is outputted to the amplifier 110. The amplifier 110 amplifies the inputted multi-carrier signal and outputs it to the exterior. Since the multi-carrier signal is given the distortion compensation characteristic having an inverse characteristic of the nonlinear characteristic generated in the amplifier 110, the multi-carrier signal is theoretically amplified without distortion.

The amplified multi-carrier signal is, other than outputted to the exterior, also fed back to the predistorter 109 from the distributor 111.

The nonlinear characteristic of the amplifier 110 changes due to aged deterioration, temperature characteristics or the like, so that there arises a case where the distortion can not be compensated by the distortion compensation characteristic given in the predistorter 109. Accordingly, the predistorter 109 carries out adaptive predistortion wherein a distortion component remaining without compensation is extracted from the fed-back amplified multi-carrier signal, and the distortion compensation characteristic is corrected based on the extracted distortion component so as to be adapted to a change of the nonlinear characteristic.

The amplified multi-carrier signal fed back from the distributor 111 is inputted to the mixer 127 in the predistorter 109. The mixer 127 performs frequency conversion of the inputted signal to convert it to the frequency outputted from the VCO 126, and outputs it to the LPF 128. With respect to the multi-carrier signal subjected to the frequency conversion, the LPF 128 attenuates frequency components above a constant frequency, thereby to extract a distortion component. The extracted distortion component is inputted to the A/D converter 129 as a distortion component signal so as to be digital-converted.

The digital-converted distortion component signal is inputted to the table producing section 125. Based on the inputted distortion component signal, the table producing section 125 outputs the control commands to the attenuation control section 121-1 and the phase control section 121-2 for updating the LUTs stored in the respective control sections so as to minimize the distortion component.

The attenuation control section 121-1 and the phase control section 121-2 respectively update the LUTs based on the inputted control commands to adjust the attenuations and the phase control amounts. Thereafter, in the respective control sections, the attenuation processing and the phase control processing of the multi-carrier signal are performed based on the updated LUTs, so that the distortion compensation characteristic adapted to the change of the nonlinear characteristic can be given.

The table producing section 125 outputs the control signal to the VCO 126. According to the control signal, the VCO 126 updates the frequency for the distortion component extraction.

The predistorter 109 of FIG. 2 performs the adaptive predistortion for extracting the distortion component. As other adaptive predistortion, the table producing section 125 may demodulate the fed-back amplified multi-carrier signal and compare it with the multi-carrier signal outputted from the coupler 105, and then, update the LUTs of the attenuation control section 121-1 and the phase control section 121-2 so as to minimize an error.

Figure 3:
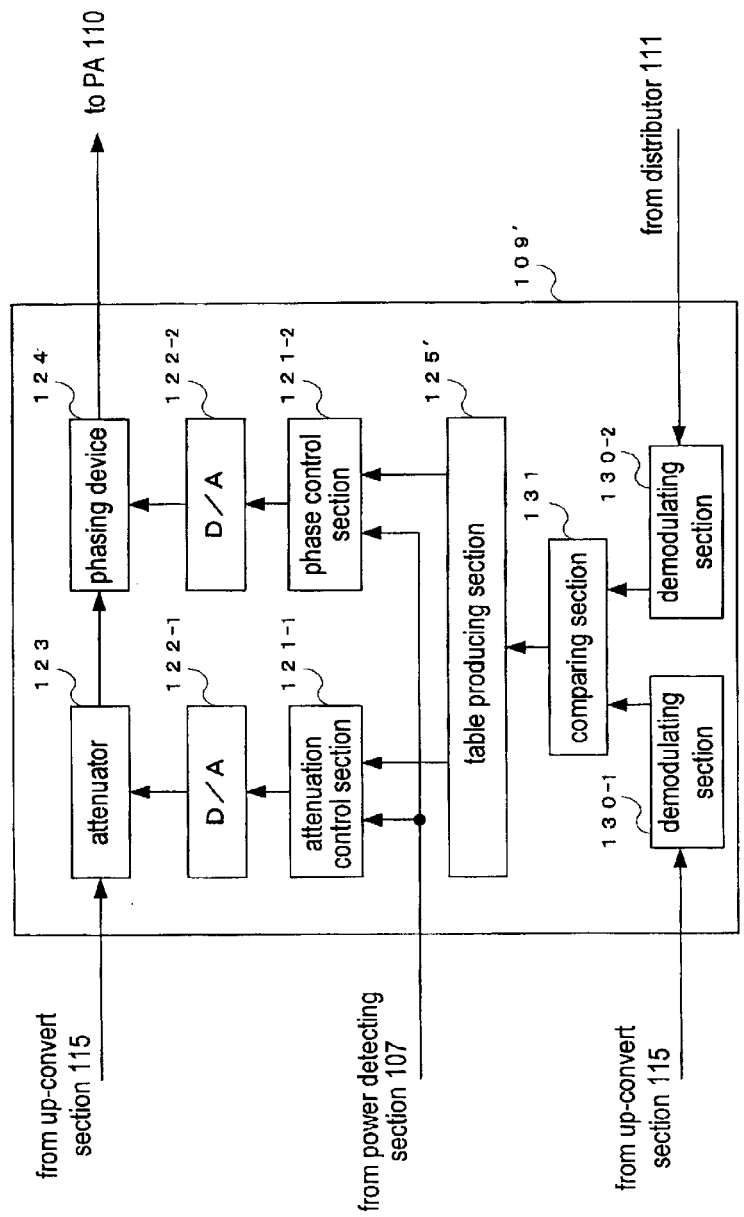
FIG. 3 is a structural block diagram of a predistorter 109'.

A structure and operation of a predistorter which performs the foregoing control will be described referring to FIG. 3, with respect to mainly a difference as compared with the predistorter of FIG. 2. FIG. 3 is a structural block diagram of another predistorter for use in the distortion compensation amplifying device according to the embodiment of the present invention. Explanation will be made by assigning the same reference signs to portions having the same structure as the predistorter of FIG. 2.

As compared with the predistorter of FIG. 2, a difference resides in that a predistorter 109' of FIG. 3 includes a demodulating section 130-1 for demodulating the multi-carrier signal outputted from the up-convert section 115, a demodulating section 130-2 for demodulating the multi-carrier signal fed back from the distributor 111, a comparing section 131 for comparing the demodulated contents in the demodulating sections 130-1 and 130-2 to output a comparison result to a table producing section 125', and the table producing section 125' for outputting, based on the comparison result outputted from the comparing section 131, control commands for updating the LUTs stored in the attenuation control section 121-1 and the phase control section 121-2, to the respective control sections 121-1 and 121-2.

In the predistorter 109' of FIG. 3, the demodulating section 130-1 demodulates the multi-carrier signal outputted from the up-convert section 115, and outputs the demodulated contents (envelope detection contents) to the comparing section 131. The demodulating section 130-2 demodulates the multi-carrier signal fed back from the distributor 111, and outputs the demodulated contents to the comparing section 131.

The comparing section 131 includes therein a memory and digital-converts the demodulated contents outputted from the demodulating sections 130-1 and 130-2 for storage in the memory. Then, the comparing section 131 multiplies the demodulated contents (envelope detected data) from the demodulating section 130-1 by an amplification factor of the PA 110, and stores it in the memory. This causes the demodulated contents (demodulated input data subjected to the multiplication) in the demodulating section 130-1 and the demodulated contents (demodulated fed-back data) in the demodulating section 130-2 to be signals of the same level.

In the comparing section 131, a time required for the input signal from entering the PA 110 for amplification to feeding back from the distributor 111 is set in advance. The comparing section 131 reads from the memory the demodulated fed-back data and the demodulated input data subjected to the multiplication which was stored earlier than the demodulated fed-back data by the set time, and compares them. With this processing, the comparing section 131 can compare the input data and the fed-back data by matching the timing.

The comparison result about the demodulated contents in the comparing section 131 is outputted to the table producing section 125'. The table producing section 125' judges an error based on the comparison result, and outputs control signals to the attenuation control section 121-1 and the phase control section 121-2 for updating the LUTs stored in the respective control sections so as to minimize the error.

The attenuation control section 121-1 and the phase control section 121-2 respectively update the LUTs based on the inputted control commands to adjust the attenuations and the phase control amounts. Thereafter, the respective control sections carry out the attenuation processing and the phase control processing of the multi-carrier signal based on the update LUTs, so that a control which can reduce an error of the demodulated contents is made possible.

In the amplifying device of FIG. 1, if the predistorter 109 is not adaptive, i.e. does not perform the adaptive predistortion, and thus no feedback of the multi-carrier signal is required, the distributor 111 is not necessary.

Figure 4:
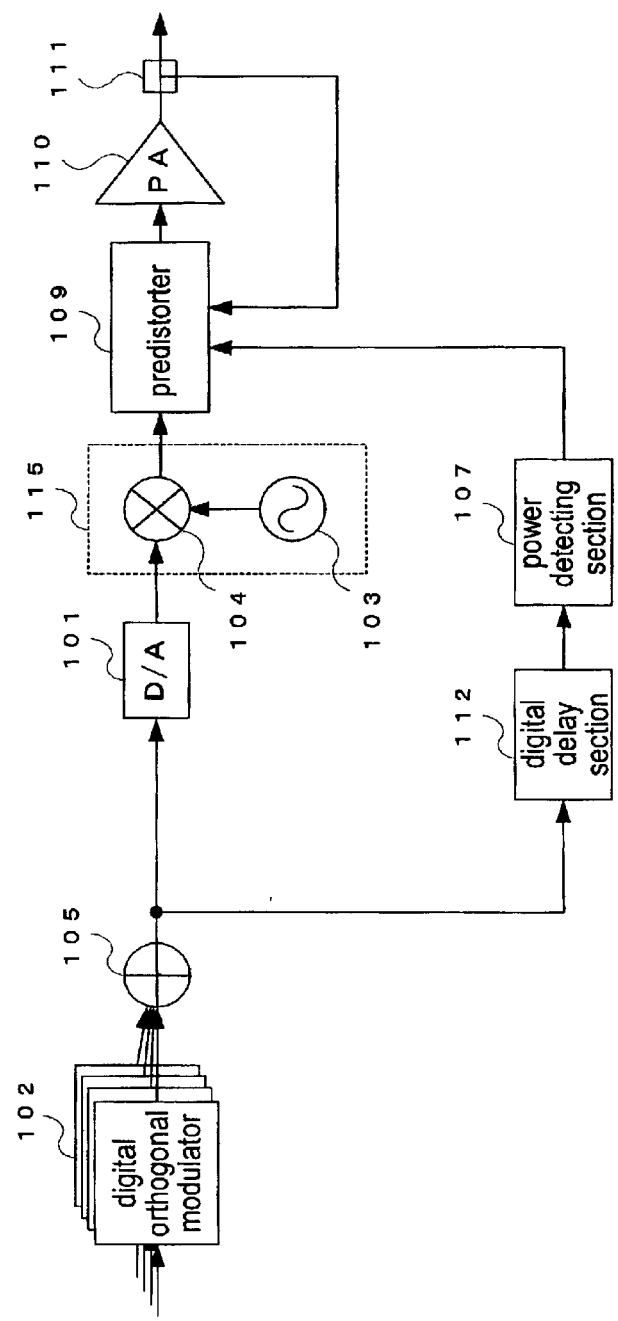
FIG. 4 is a second structural block diagram of a distortion compensation amplifying device according to an embodiment of the present invention.

FIG. 4 is a second structural block diagram of a distortion compensation amplifying device according to the embodiment of the present invention. In the amplifying device of FIG. 4, the digital delay section 112 is provided on an input side of the power detecting section 107 in the control system.

The structure of the amplifying device shown in FIG. 4 is effective when a time required for outputting the multi-carrier signal to the predistorter 109 in the main signal system is greater than a time required for the power value detection in the control system. In the amplifying device of FIG. 4, the predistorter 109' shown in FIG. 3 may be used instead of the predistorter 109.

According to the amplifying device of FIG. 4, even when the time required for outputting the multi-carrier signal to the predistorter 109 is greater than the time required for the power value detection, the distortion compensation of the amplifier can be accurately performed.

In accordance with the distortion compensation amplifying device according to the embodiment of the present invention, the input signals are subjected to the digital orthogonal modulation using the IF and further to the offset rotation processing in the digital orthogonal modulators, then combined in the coupler 105 and bifurcated into the main signal system and the control system, and the detection of the power value is performed at the IF band in the power detecting section of the control system. Therefore, the offset rotation processing of the input signals in the power detection is not required, so that a structure for matching the phases of the multi-carrier signal and the power value signal is not particularly required, resulting in improving the distortion compensation performance without using the analog delay line.

Further, since only one D/A converter 101 and only one pair of the VCO 103 and the mixer 104 in the up-convert section 115 are sufficient in number, a circuit scale of the whole amplifying device can be reduced as compared with the prior art.

According to the present invention, there is provided an amplifying device, wherein input signals are, per carrier, subjected to digital orthogonal modulation and further to offset rotation processing in digital orthogonal modulating sections, then combined in a coupling section, and a digital delay section for performing digital-delaying for a constant time is used in a main signal system or a control system instead of an analog delay line, and further, a distortion compensating section gives distortion compensation to a multi-carrier signal for canceling a nonlinear characteristic generated in an amplifying section, based on a power value and a portion of an output from a distributing section. Therefore, the amplifying device according to the present invention requires no analog delay lines and enables a phase control between the main signal system and the control system in the digital orthogonal modulating sections, and thus can be provided with reduced size, weight and cost.

Further, there is also provided an amplifying device, wherein input signals are, per carrier, subjected to digital orthogonal modulation and further to offset rotation processing in digital orthogonal modulating sections, then combined in a coupling section, and a digital delay section for performing digital-delaying for a constant time is used in a main signal system or a control system instead of an analog delay line, and further, a distortion compensating section controls a multi-carrier signal for reducing an error between the demodulated contents of outputs from an up-convert section and a distributing section relative to a power value. Therefore, the amplifying device according to the present invention requires no analog delay lines and enables a phase control between the main signal system and the control system in the digital orthogonal modulating sections, and thus can be provided with reduced size, weight and cost.

What is claimed is:

1. An amplifying device comprising:
   orthogonal modulating sections each for applying digital orthogonal modulation to an input signal per carrier and performing offset rotation processing of the signal per carrier subjected to the digital orthogonal modulation;
   a coupling section for combining the signals of the respective carriers subjected to the digital orthogonal modulation and the offset rotation processing, thereby to output a multi-carrier signal;
   a digital delay section for digital-delaying the output from said coupling section for a constant time;
   a digital/analog converting section for converting the digital-delayed signal to an analog signal;
   an up-convert section for converting the analog signal to a radio frequency;

a power detecting section for detecting a power value based on the output from said coupling section;

an amplifying section for amplifying the multi-carrier signal;

a distributing section for distributing an output from said amplifying section; and a distortion compensating section for giving distortion compensation to the multi-carrier signal from said up-convert section for canceling a nonlinear characteristic generated in said amplifying section, based on the power value detected in said power detecting section and an output from said distributing section.

2. An amplifying device comprising:

orthogonal modulating sections each for applying digital orthogonal modulation to an input signal per carrier and performing offset rotation processing of the signal per carrier subjected to the digital orthogonal modulation;

a coupling section for combining the signals of the respective carriers subjected to the digital orthogonal modulation and the offset rotation processing, thereby to output a multi-carrier signal;

a digital delay section for digital-delaying the output from said coupling section for a constant time;

a digital/analog converting section for converting the digital-delayed signal to an analog signal;

an up-convert section for converting the analog signal to a radio frequency;

a power detecting section for detecting a power value based on the output from said coupling section;

an amplifying section for amplifying the multi-carrier signal;

a distributing section for distributing an output from said amplifying section; and a distortion compensating section for demodulating the multi-carrier signal from said up-convert section and an output from said distributing section, comparing the demodulated contents by matching the timing, and controlling the multi-carrier signal from said up-convert section based on a comparison result so as to reduce an error between the demodulated contents relative to the power value detected in said power detecting section.

3. An amplifying device comprising:

orthogonal modulating sections each for applying digital orthogonal modulation to an input signal per carrier and performing offset rotation processing of the signal per carrier subjected to the digital orthogonal modulation;

a coupling section for combining the signals of the respective carriers subjected to the digital orthogonal modulation and the offset rotation processing, thereby to output a multi-carrier signal;

a digital/analog converting section for converting the output from said coupling section to an analog signal;

an up-convert section for converting the analog signal to a radio frequency;

a digital delay section for digital-delaying the output from said coupling section for a constant time;

a power detecting section for detecting a power value based on an output from said digital delay section;

an amplifying section for amplifying the multi-carrier signal;

a distributing section for distributing an output from said amplifying section; and a distortion compensating section for giving distortion compensation to the multi-carrier signal from said up-convert section for canceling a nonlinear characteristic generated in said amplifying section, based on the power value detected in said power detecting section and an output from said distributing section.

4. An amplifying device comprising:

orthogonal modulating sections each for applying digital orthogonal modulation to an input signal per carrier and performing offset rotation processing of the signal per carrier subjected to the digital orthogonal modulation;

a coupling section for combining the signals of the respective carriers subjected to the digital orthogonal modulation and the offset rotation processing, thereby to output a multi-carrier signal;

a digital/analog converting section for converting the output from said coupling section to an analog signal;

an up-convert section for converting the analog signal to a radio frequency;

a digital delay section for digital-delaying the output from said coupling section for a constant time;

a power detecting section for detecting a power value based on an output from said digital delay section;

an amplifying section for amplifying the multi-carrier signal;

a distributing section for distributing a portion of an output from said amplifying section; and a distortion compensating section for demodulating the multi-carrier signal from said up-convert section and an output from said distributing section, comparing the demodulated contents by matching the timing, and controlling the multi-carrier signal from said up-convert section based on a comparison result so as to reduce an error between the demodulated contents relative to the power value detected in said power detecting section.

5. A base station device in a mobile communication system, said device comprising the amplifying device according to claim 1.

6. A base station device in a mobile communication system, said device comprising the amplifying device according to claim 3.

7. A base station device in a mobile communication system, said device comprising the amplifying device according to claim 3.

8. A base station device in a mobile communication system, said device comprising the amplifying device according to claim 4.

* * * * *